(12) United States Patent
Carstensen

(10) Patent No.: US 6,693,015 B2
(45) Date of Patent: Feb. 17, 2004

(54) METHOD FOR IMPROVED PROCESSING AND ETCHBACK OF A CONTAINER CAPACITOR

(75) Inventor: Robert K. Carstensen, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/928,308

(22) Filed: Aug. 14, 2001

(65) Prior Publication Data

US 2002/0000596 A1 Jan. 3, 2002

Related U.S. Application Data

(62) Division of application No. 09/235,752, filed on Jan. 25, 1999, now Pat. No. 6,319,789.

(51) Int. Cl.[7] .............................................. H01L 21/336
(52) U.S. Cl. ..................... 438/306; 438/296; 438/301; 438/303; 438/310; 438/532; 438/396; 438/239; 438/242; 438/253; 438/387
(58) Field of Search ................................. 257/296, 301, 257/303, 306–310, 532; 438/396, 239, 242, 253, 387

(56) References Cited

U.S. PATENT DOCUMENTS

| 5,401,681 A | | 3/1995 | Dennison |
| 5,854,119 A | | 12/1998 | Wu et al. |
| 5,981,989 A | * | 11/1999 | Miyake ....................... 257/296 |
| 6,027,984 A | | 2/2000 | Thakur et al. |
| 6,037,213 A | | 3/2000 | Shih et al. |
| 6,042,999 A | | 3/2000 | Lin et al. |
| 6,077,790 A | | 6/2000 | Li et al. |

\* cited by examiner

Primary Examiner—Matthew Smith
Assistant Examiner—V. Yevsikov
(74) Attorney, Agent, or Firm—Dickstein Shapiro Morin & Oshinsky LLP

(57) ABSTRACT

A capacitor having improved size for enhanced capacitance and a method of forming the same are disclosed. In one embodiment, the capacitor is a stacked container capacitor used in a dynamic random access memory circuit. The capacitor provides a capacitor that has high storage capacitance which provides an increased efficiency for a cell without an increase in the size of the cell.

38 Claims, 17 Drawing Sheets

METHOD FOR IMPROVED PROCESSING AND ETCHBACK OF A CONTAINER CAPACITOR

This application is a divisional of application Ser. No. 09/235,752, filed on Jan. 25, 1999 is now U.S. Pat. No. 6,319,789, which is hereby incorporated by reference.

FIELD OF THE INVENTION

The invention relates generally to integrated circuits and more particularly to a capacitor having improved surface area for use in an integrated circuit and a method for forming the same.

BACKGROUND OF THE INVENTION

Capacitors are used in a wide variety of semiconductor circuits. Capacitors are of special concern in DRAM (dynamic random access memory) memory circuits; therefore, the invention will be discussed in connection with DRAM memory circuits. However, the invention has broader applicability and is not limited to DRAM memory circuits. It may be used in any other type of memory circuit, such as an SRAM (static random access memory), as well as in any other circuit in which capacitors are used.

DRAM memory circuits are manufactured by replicating millions of identical circuit elements, known as DRAM cells, on a single semiconductor wafer. A DRAM cell is an addressable location that can store one bit (binary digit) of data. In its most common form, a DRAM cell consists of two circuit components: a storage capacitor and an access field effect transistor.

FIG. 1 illustrates a portion of a DRAM memory circuit containing two neighboring DRAM cells 10. For each cell, one side of the storage capacitor 14 is connected to a reference voltage, which is typically one half of the internal operating voltage (the voltage corresponding to a logical "1" signal) of the circuit. The other side of the storage capacitor 14 is connected to the drain of the access field effect transistor 12. The gate of the access field effect transistor 12 is connected to a signal referred to as the word line 18. The source of the field effect transistor 12 is connected to a signal referred to as the bit line 16. With the circuit connected in this manner, it is apparent that the word line controls access to the storage capacitor 14 by allowing or preventing the signal (a logic "0" or a logic "1") on the bit line 16 to be written to or read from the storage capacitor 14.

The manufacturing of a DRAM cell includes the fabrication of a transistor, a capacitor, and three contacts: one each to the bit line, the word line, and the reference voltage. DRAM manufacturing is a highly competitive business. There is continuous pressure to decrease the size of individual cells and increase memory cell density to allow more memory to be squeezed onto a single memory chip. However, it is necessary to maintain a sufficiently high storage capacitance to maintain a charge at the refresh rates currently in use even as cell size continues to shrink. This requirement has led DRAM manufacturers to turn to three dimensional capacitor designs, including trench and stacked capacitors. Stacked capacitors are capacitors which are stacked, or placed, over the access transistor in a semiconductor device. In contrast, trench capacitors are formed in the wafer substrate beneath the transistor. For reasons including ease of fabrication and increased capacitance, most manufacturers of DRAMs larger than 4 Megabits use stacked capacitors. Therefore, the invention will be discussed in connection with stacked capacitors but should not be understood to be limited thereto. For example, use of the invention in trench or planar capacitors is also possible.

One widely used type of stacked capacitor is known as a container capacitor. Known container capacitors are in the shape of an upstanding tube (cylinder) having an oval or circular cross section. The wall of each tube consists of two plates of conductive material such as doped polycrystalline silicon (referred to herein as polysilicon or poly) separated by a dielectric. A preferred dielectric is tantalum pentoxide ($Ta_2O_5$). The bottom end of the tube is closed, with the outer wall in contact with either the drain of the access transistor or a conductive plug which itself is in contact with the drain. The other end of the tube is open (the tube is filled with an insulative material later in the fabrication process). The sidewall and closed end of the tube form a container; hence the name "container capacitor." Although the invention will be further discussed in connection with stacked container capacitors, the invention should not be understood to be limited thereto.

The electrodes in a DRAM cell capacitor must be conductive, and must protect the dielectric film from interaction with interlayer dielectrics (e.g., BPSG) and from the harsh thermal processing encountered in subsequent steps of DRAM process flow. For example, $Ta_2O_5$ dielectrics may be used for high density DRAMs, such as 64 Mbit and 256 Mbit DRAMs, because chemical vapor deposition (CVD) of $Ta_2O_5$ provides a high dielectric constant (about 20–25) and good step coverage.

Several methods have been attempted to increase capacitance, including depositing HSG inside a container capacitor together with a smooth polysilicon deposited on the outside of the container, depositing a smooth metal on both the inside and outside of the capacitor, and depositing a double sided HSG. However, these prior methods require additional process steps which deviate from the standard IC fabrication process.

SUMMARY OF THE INVENTION

The present invention has advantages over the previous methods in that capacitor has improved surface area by eliminating the plug connection to the active area and additionally forming a portion of the capacitor in a second BPSG layer. By eliminating the plug connection and forming a portion of the capacitor in a second BPSG layer over the area where the plug was, the present invention provides a fabrication process and capacitor structure that achieves high storage capacitance with a modified standard fabrication process without increasing the frequency of capacitor defects or the size of the capacitor. The present invention provides a capacitor formed by an improved process and etchback of the polysilicon plug to form a capacitor structure that achieves high storage capacitance, and has the configuration shown, for example, in FIG. 2. The improved capacitor has a first lower section formed in a first BPSG layer 142 having a width x and a second upper section formed in a second BPSG layer 148 having a width y which is greater than width x. By forming the capacitor in a second section, the present invention increases the capacitance of the device by modifying the standard IC fabrication process and without requiring time consuming and costly processing.

DETAILED DESCRIPTION OF THE PREFERRED EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the present invention.

The terms "wafer" and "substrate" are to be understood as including silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in the base semiconductor structure or foundation. In addition, the semiconductor need not be silicon-based, but could be based on silicon-germanium, germanium, or gallium arsenide.

Figure 2:
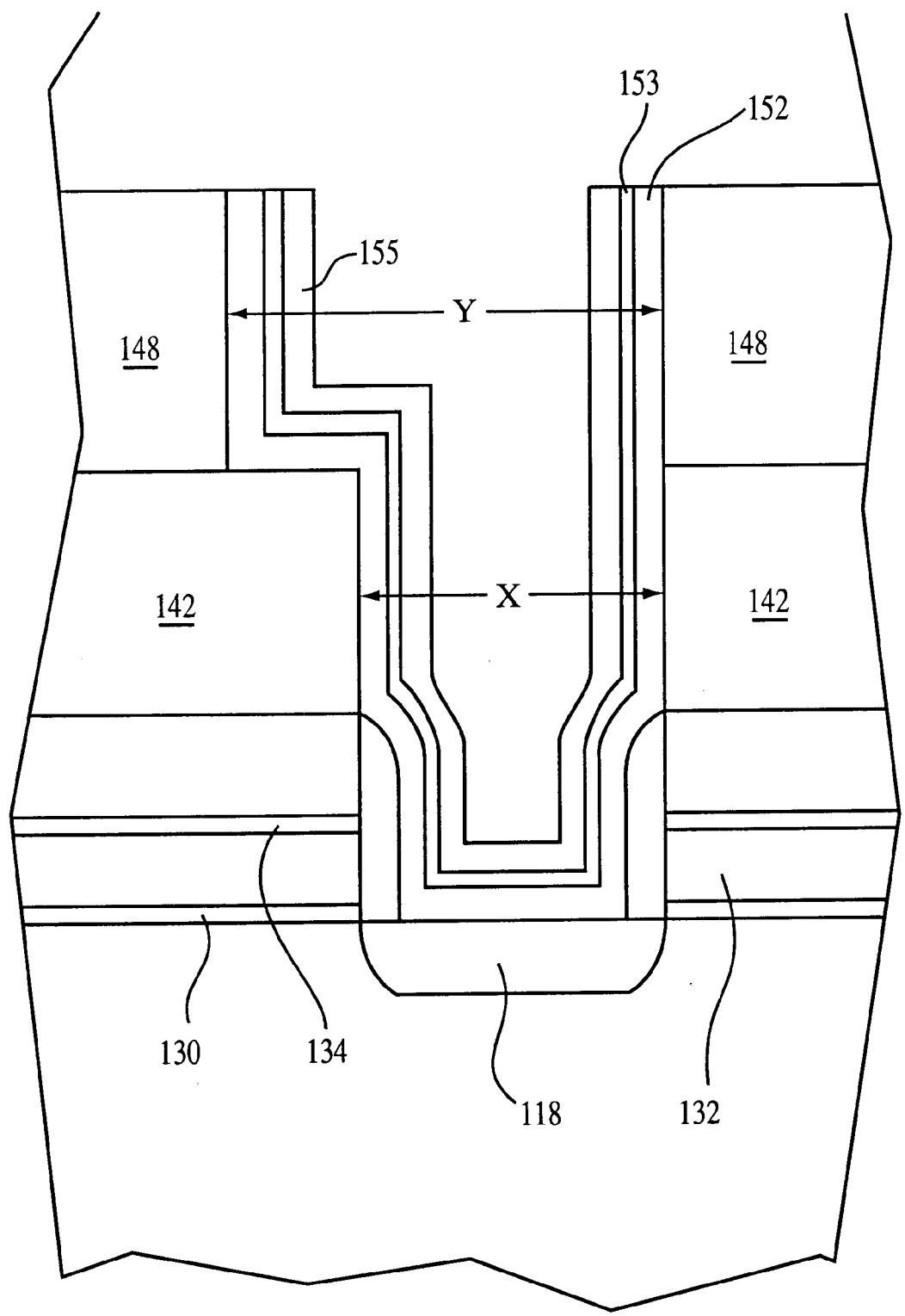
FIG. 2 is a cross section of a container capacitor formed according to the present invention.

Reference is now made to FIG. 2. The capacitor according to the present invention has a first lower section formed in a first BPSG layer 142 having a width x and a second upper section formed in a second BPSG layer 148 having a width y which is greater than width x as illustrated in the figure. By forming the capacitor in a second section, the present invention increases the capacitance of the device by modifying the standard IC fabrication process and without requiring time consuming and costly processing.

An exemplary construction of a fabrication process for a container capacitor according to one embodiment of the present invention is described below. It is to be understood, however, that this process is only one example of many possible processes.

Figure 3:
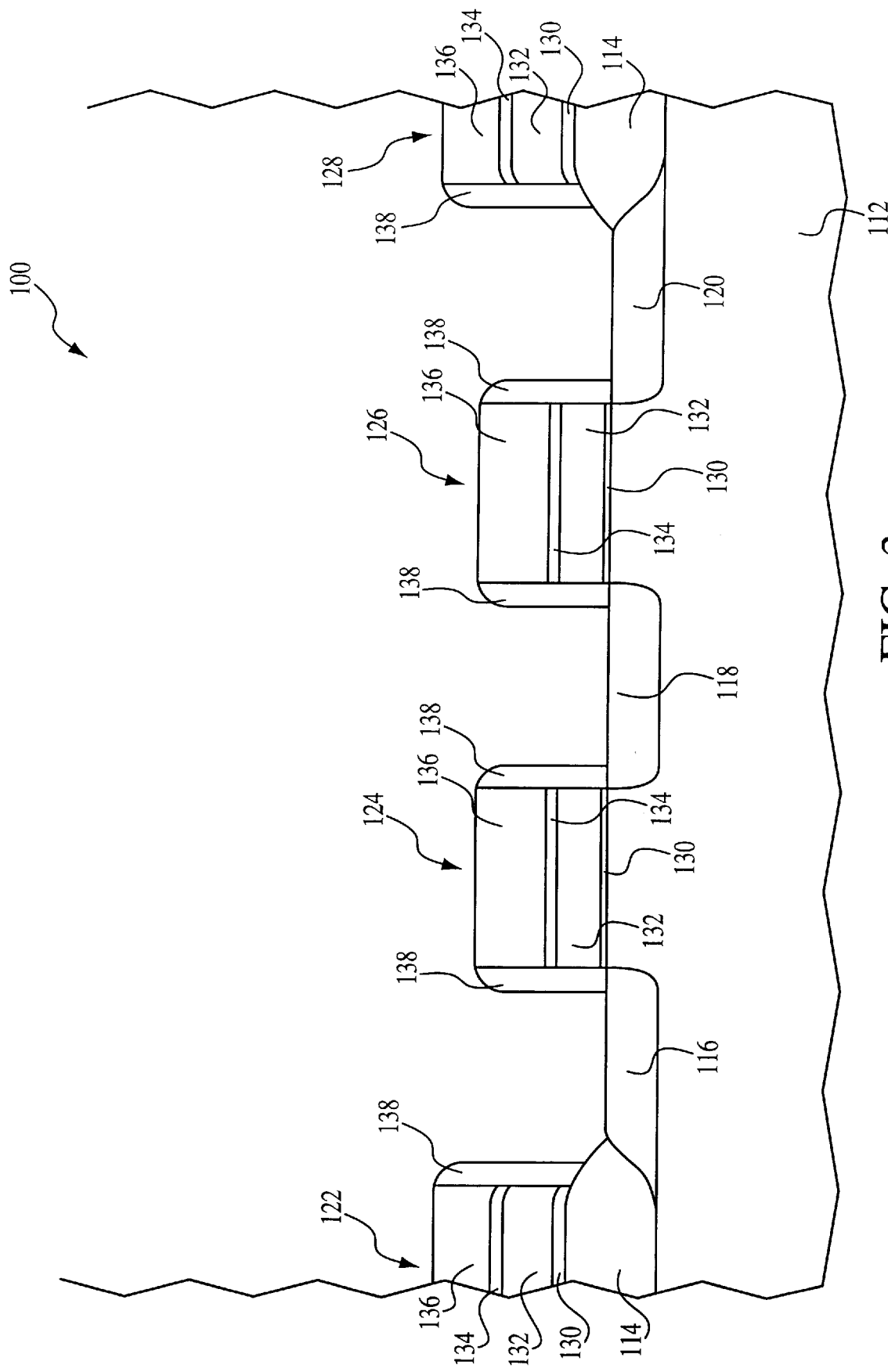
FIG. 3 is a diagrammatic cross-sectional view of a portion of a semiconductor wafer at an early processing step according to one embodiment of the present invention.

Referring now to FIG. 3, a semiconductor wafer fragment at an early processing step is indicated generally by reference numeral 100. The semiconductor wafer 100 has a substrate 112 with field isolation oxide regions 114 and active areas 116, 118, 120 formed therein. Gate stacks 122, 124, 126, 128 have been constructed on the wafer 100 in a conventional manner. Each gate stack consists of a lower gate oxide 130, a lower polysilicon layer 132, a higher conductivity silicide layer 134 and an insulating silicon nitride layer 136. Each gate stack has also been provided with insulating spacers 138, which are also composed of an insulating material, such as silicon nitride, for example. Two FETs are depicted in FIG. 3. One FET is comprised of two active areas (source/drain) 116, 118 and one word line (gate) 124. The second FET is comprised of two active areas (source/drain) 118, 120 and a second word line (gate) 126.

Figure 4:
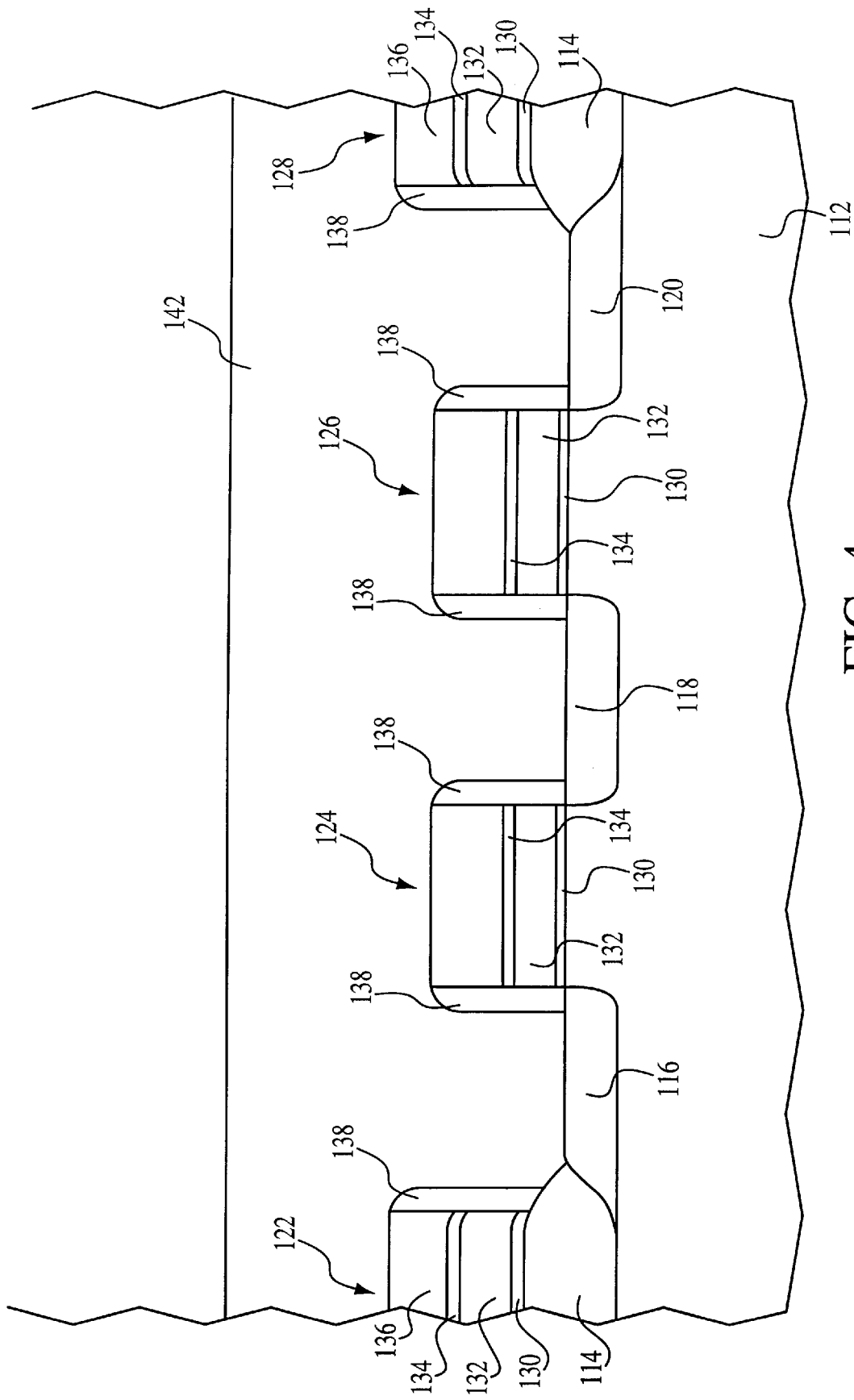
FIG. 4 is a diagrammatic cross-sectional view of a portion of a semiconductor wafer at a processing step subsequent to that shown in FIG. 3.

Referring now to FIG. 4, a first layer of insulating material 142 is deposited over the substrate 112. The insulating material preferably consists of borophosphosilicate glass (BPSG), but may also be phososilicate glass (PSG), borosilicate glass (BSG), undoped $SiO_2$ or the like. The insulating layer 142 is subsequently planarized by chemical-mechanical polishing (CMP).

Figure 5:
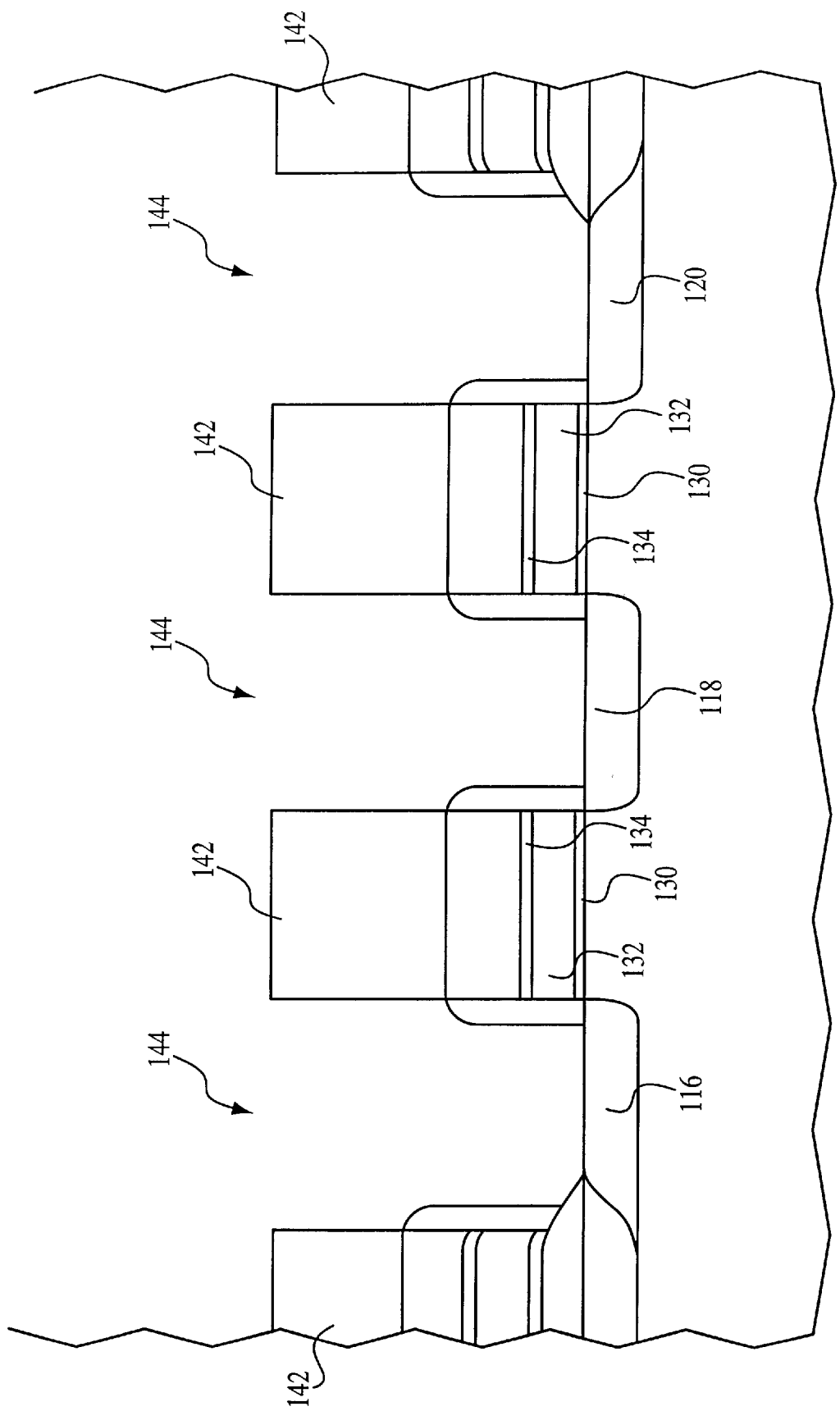
FIG. 5 is a diagrammatic cross-sectional view of a portion of a semiconductor wafer at a processing step subsequent to that shown in FIG. 4.

Referring now to FIG. 5, plug openings have been formed through the insulating layer 142. The plug openings 144 are formed through the insulating layer 142 by photomasking and a selective dry chemical etching the BPSG layer 142 which does not effect the insulating spacers 138.

Figure 6:
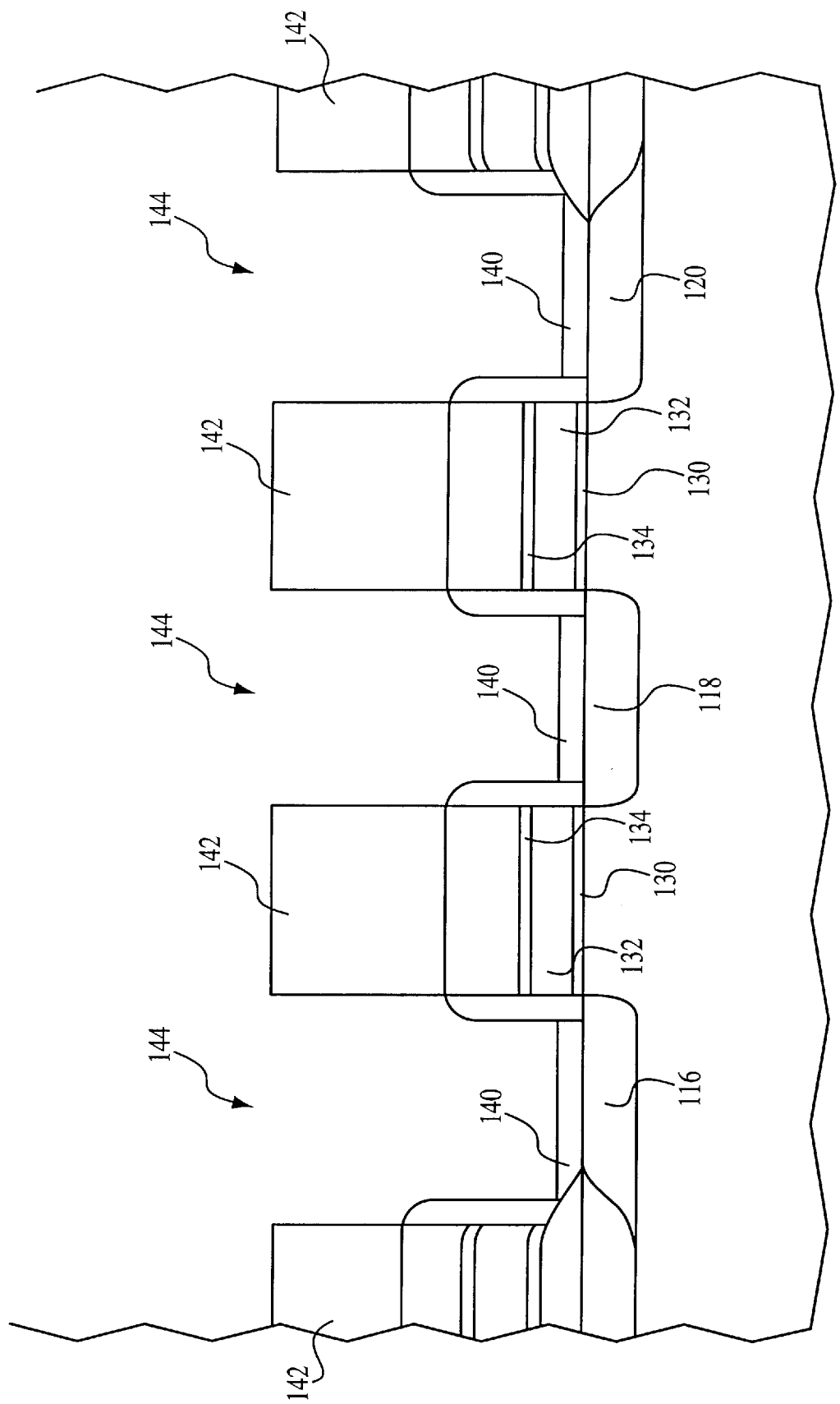
FIG. 6 is a diagrammatic cross-sectional view of a portion of a semiconductor wafer at a processing step subsequent to that shown in FIG. 5.

An oxide layer 140 is formed on the substrate in the plug openings 144 by treating the substrate with a wet chemical process such as an ozone treatment, a piranha etch or an SC1 etch to form an oxide layer as shown in FIG. 6. The oxide layer 140 is preferably formed by an ozone treatment such that the oxide layer 140 has a thickness of from about 10 to about 50 angstroms, preferably about 30 angstroms.

Figure 7:
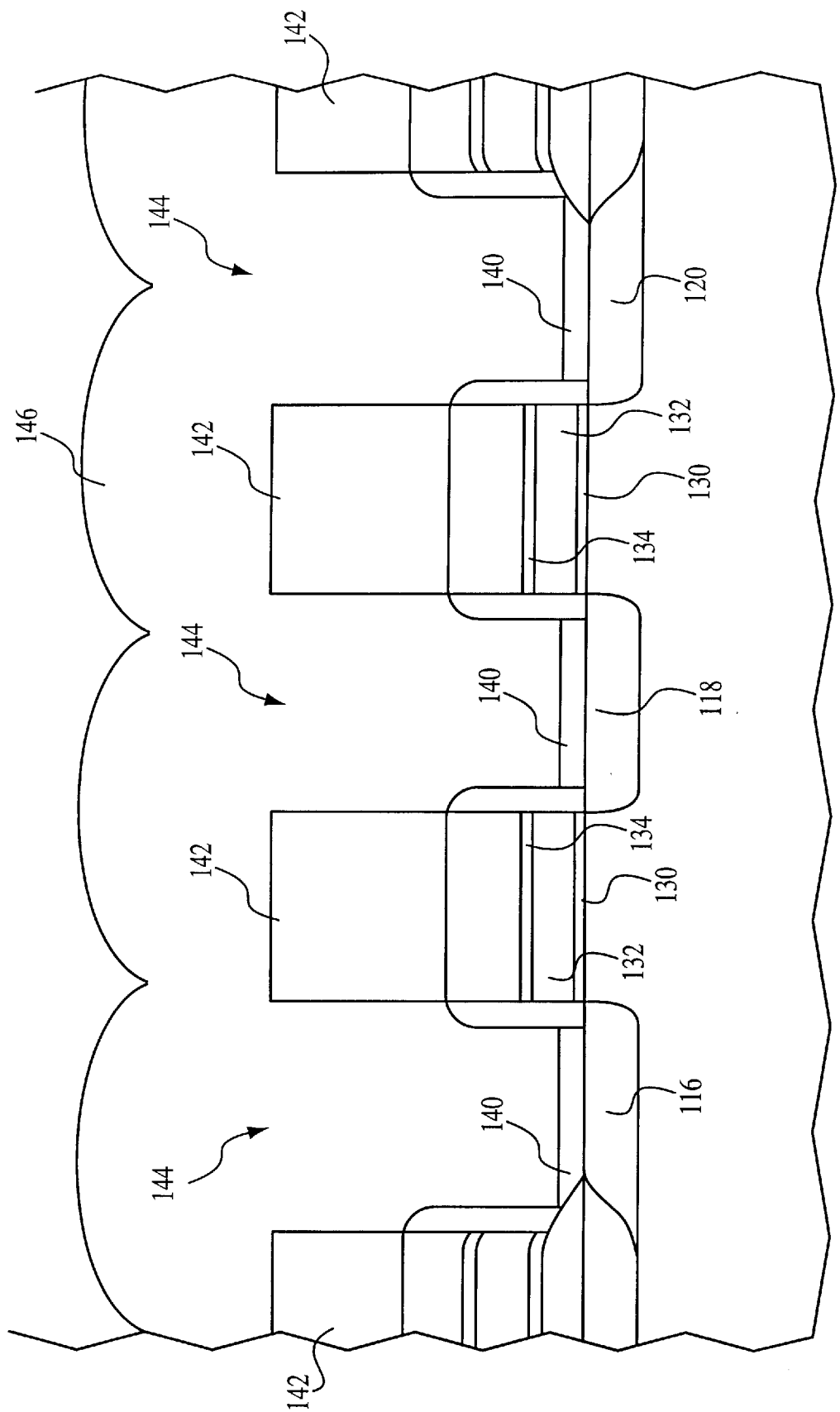
FIG. 7 is a diagrammatic cross-sectional view of a portion of a semiconductor wafer at a processing step subsequent to that shown in FIG. 6.
Figure 8:
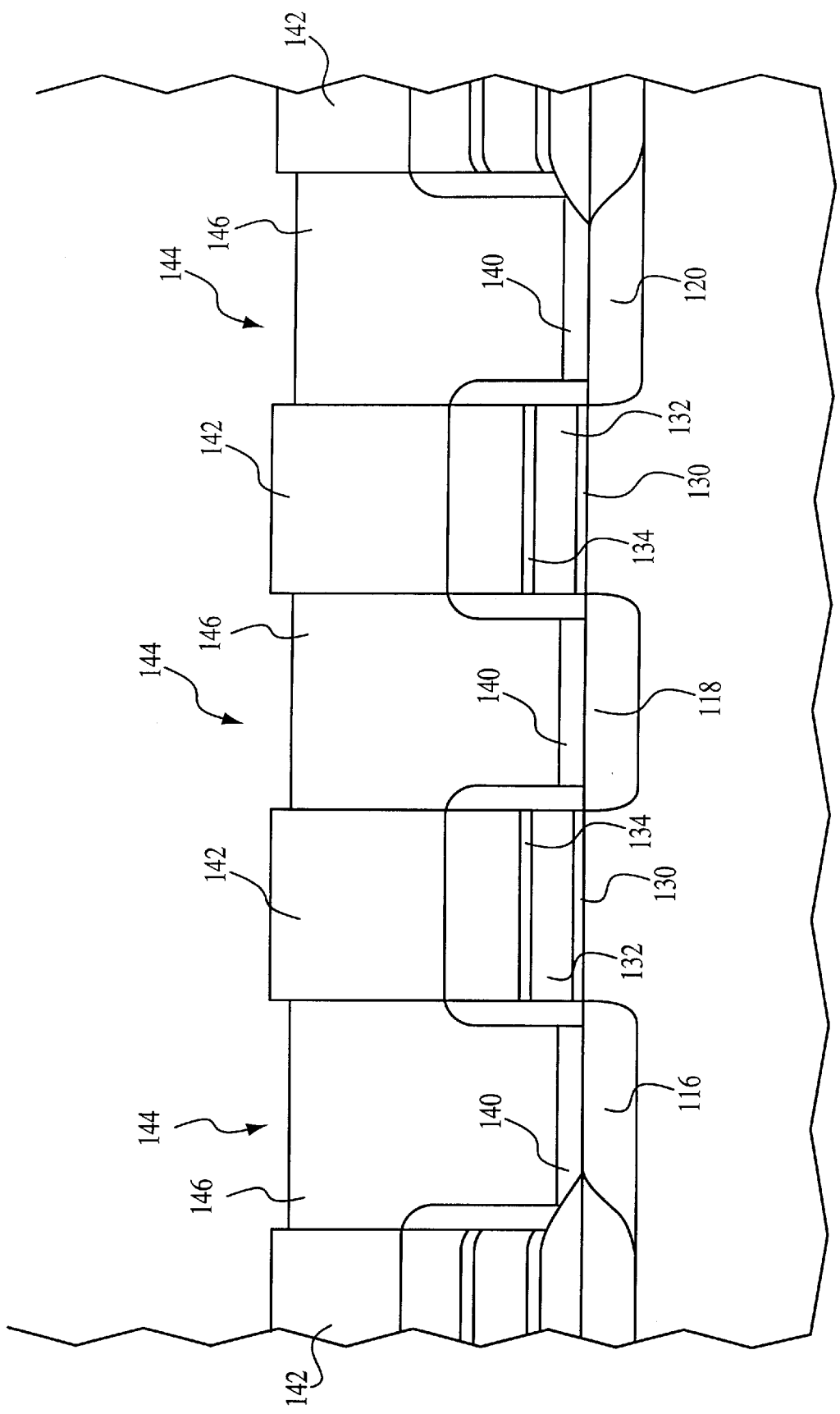
FIG. 8 is a diagrammatic cross-sectional view of a portion of a semiconductor wafer at a processing step subsequent to that shown in FIG. 7.

Referring now to FIG. 7, a layer 146 of conductive material is deposited to provide conductive material over oxide layer 140 in the plug openings 144 and over the insulating layer 142. An example of the material used to form conductive plug layer 146 is an in situ arsenic or phosphorous doped polysilicon. Referring now to FIG. 8, the conductive plug layer 146 is dry etched (or chemical-mechanical polished) to a point just below the upper surface of the BPSG layer 142 such that the remaining material of the conductive plug layer 146 forms electrically isolated plugs 146 over the active areas 116, 118, 120.

Figure 9:
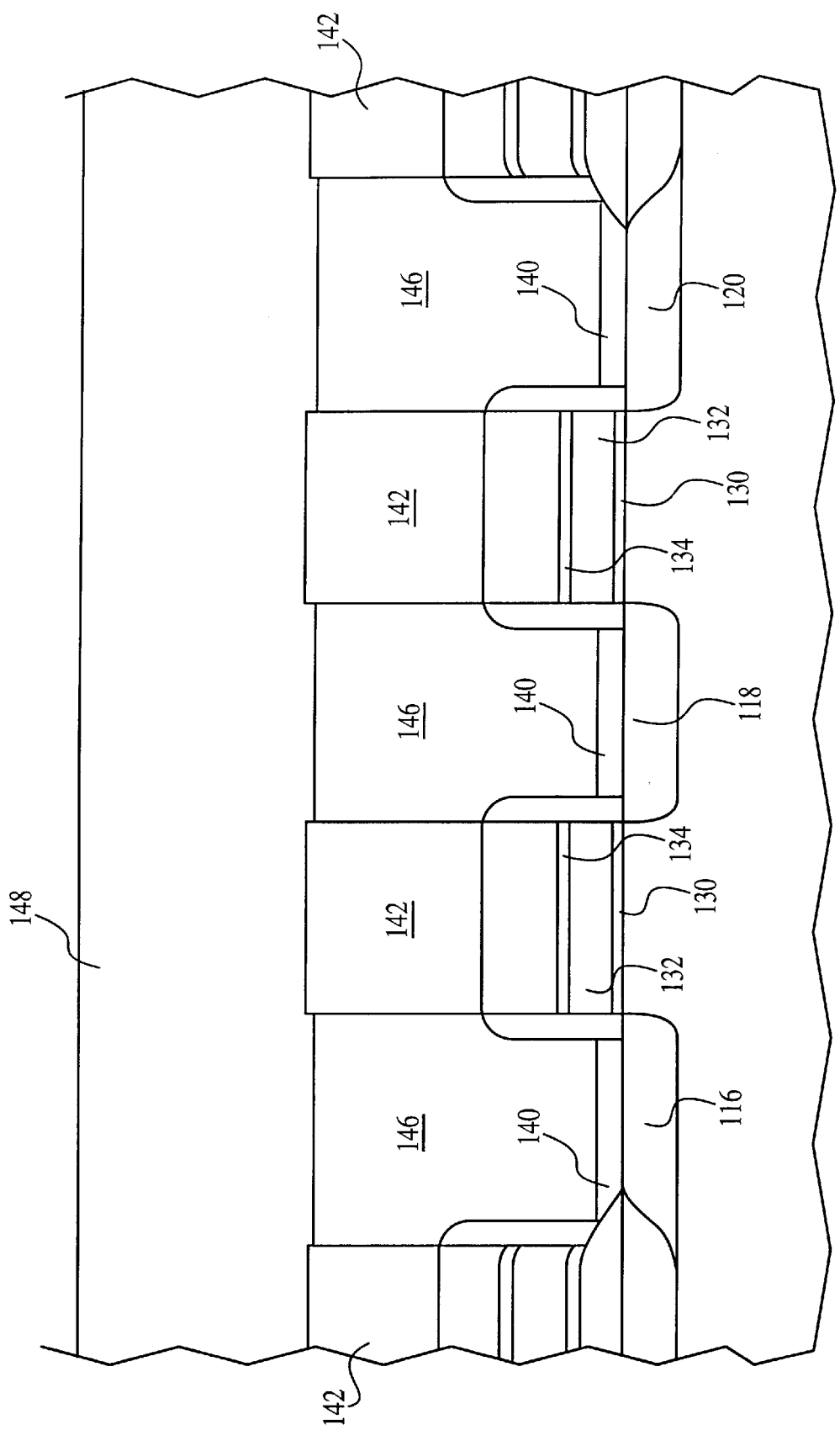
FIG. 9 is a diagrammatic cross-sectional view of a portion of a semiconductor wafer at a processing step subsequent to that shown in FIG. 8.
Figure 10:
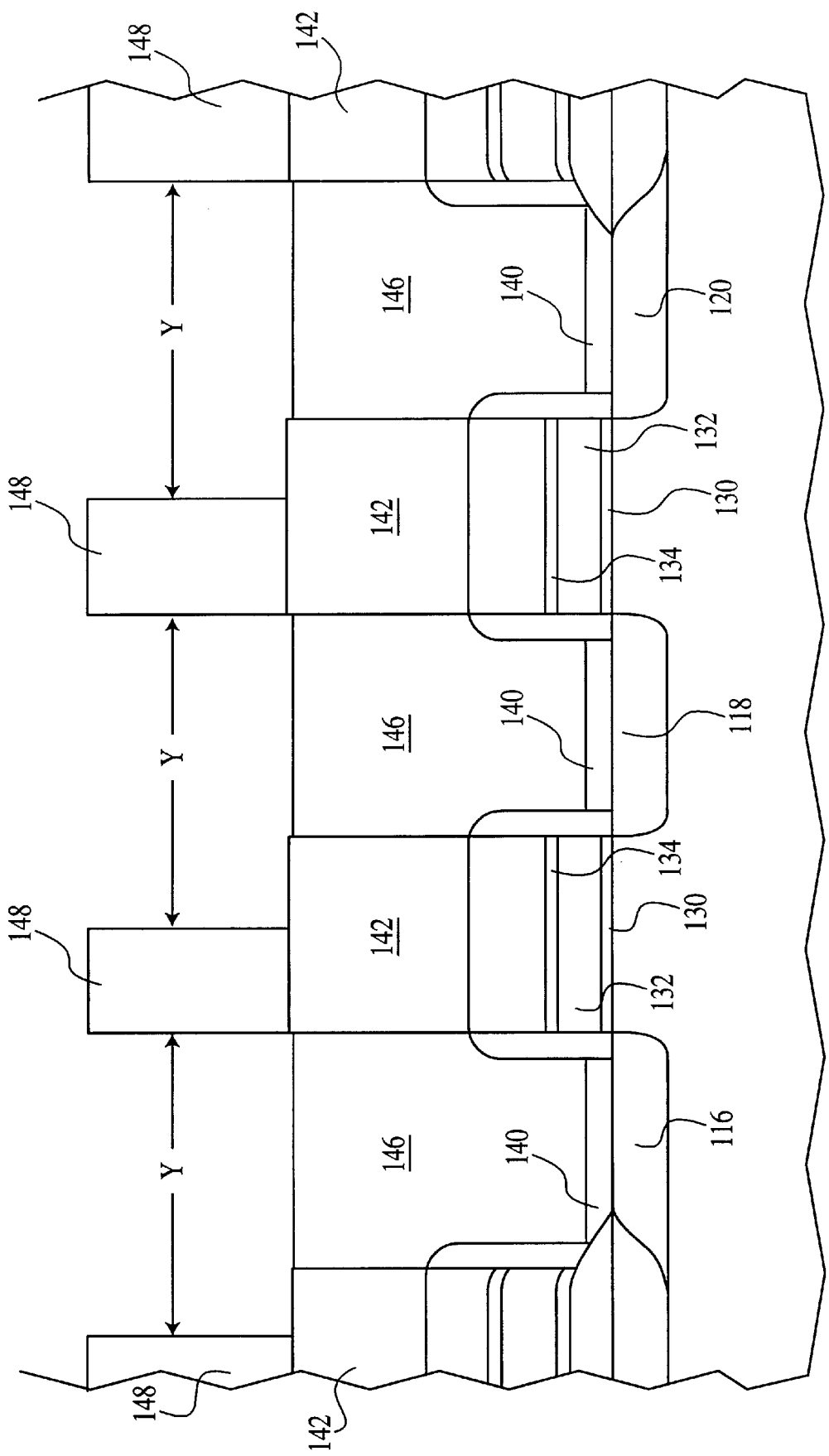
FIG. 10 is a diagrammatic cross-sectional view of a portion of a semiconductor wafer at a processing step subsequent to that shown in FIG. 9.

A second layer 148 of BPSG is then deposited on the structure and etched or removed by CMP to arrive at the structure shown in FIG. 9. A mask and resist (not shown) is applied to the substrate and the second layer 148 is selectively etched with a dry etch to remove the second BPSG layer 148 over the conductive plug 146 and the first BPSG layer 142 as shown in FIG. 10. The second BPSG layer 148 should be etched such that the space formed in the second BPSG layer 148 is wider that the plug 146 formed in the first BPSG layer 142.

Figure 11:
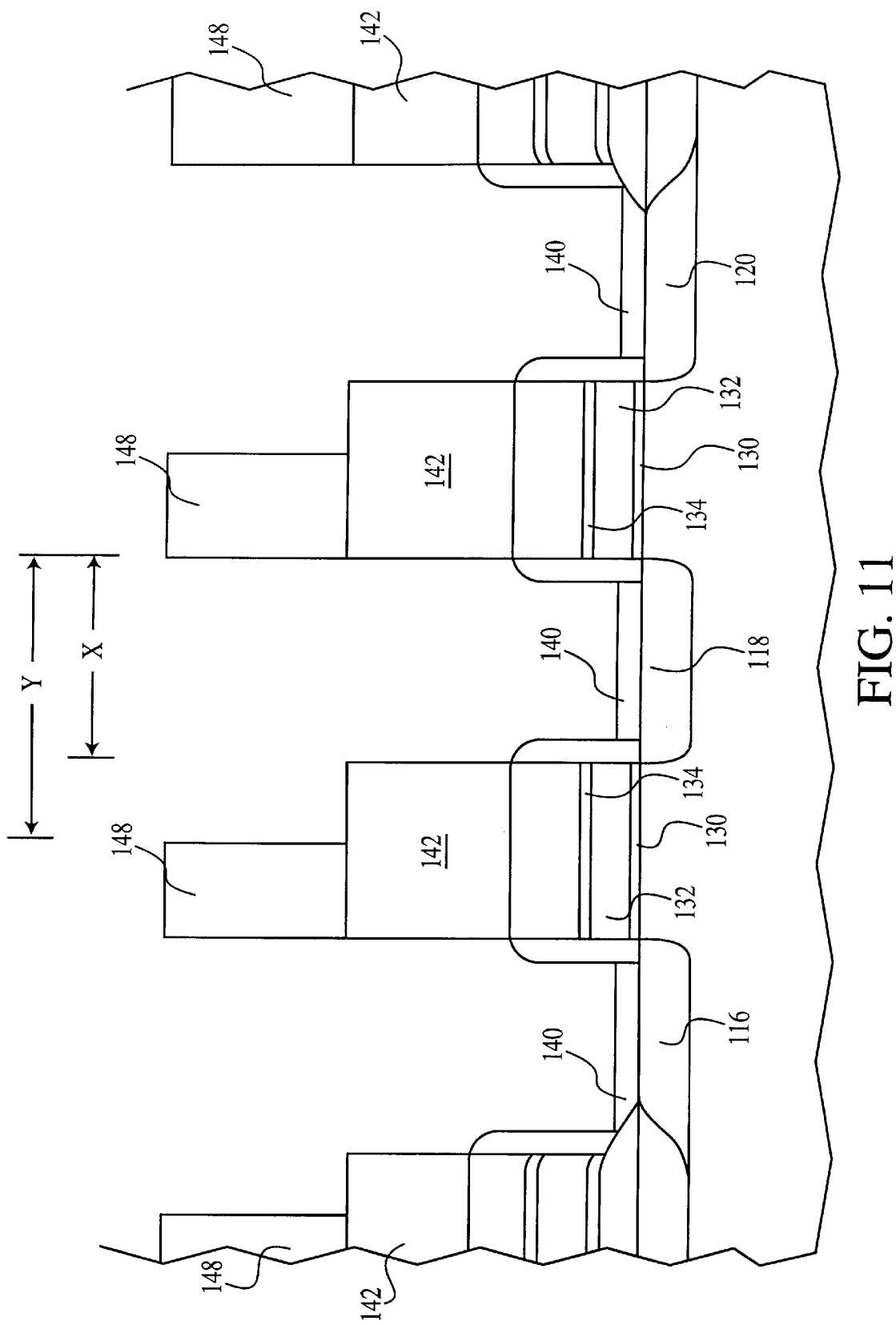
FIG. 11 is a diagrammatic cross-sectional view of a portion of a semiconductor wafer at a processing step subsequent to that shown in FIG. 10.

The conductive plug 146 is then removed from the substrate by a selective etching process as shown in FIG. 11. The conductive plug 146 is preferably selectively removed down to the level of the oxide layer 140 with an aqueous TMAH etching solution which is selective to the conductive plug 146, thereby allowing the etching process to be self limiting. The aqueous TMAH etching solution is preferably from about a 0.5% to about 5% aqueous solution, most preferably about a 2.25% aqueous solution. The conductive plug 126 is preferably etched with an aqueous TMAH etchant solution from about 30 seconds to about 60 seconds, preferably about 45 seconds at a temperature of about 55° C.

Figure 12:
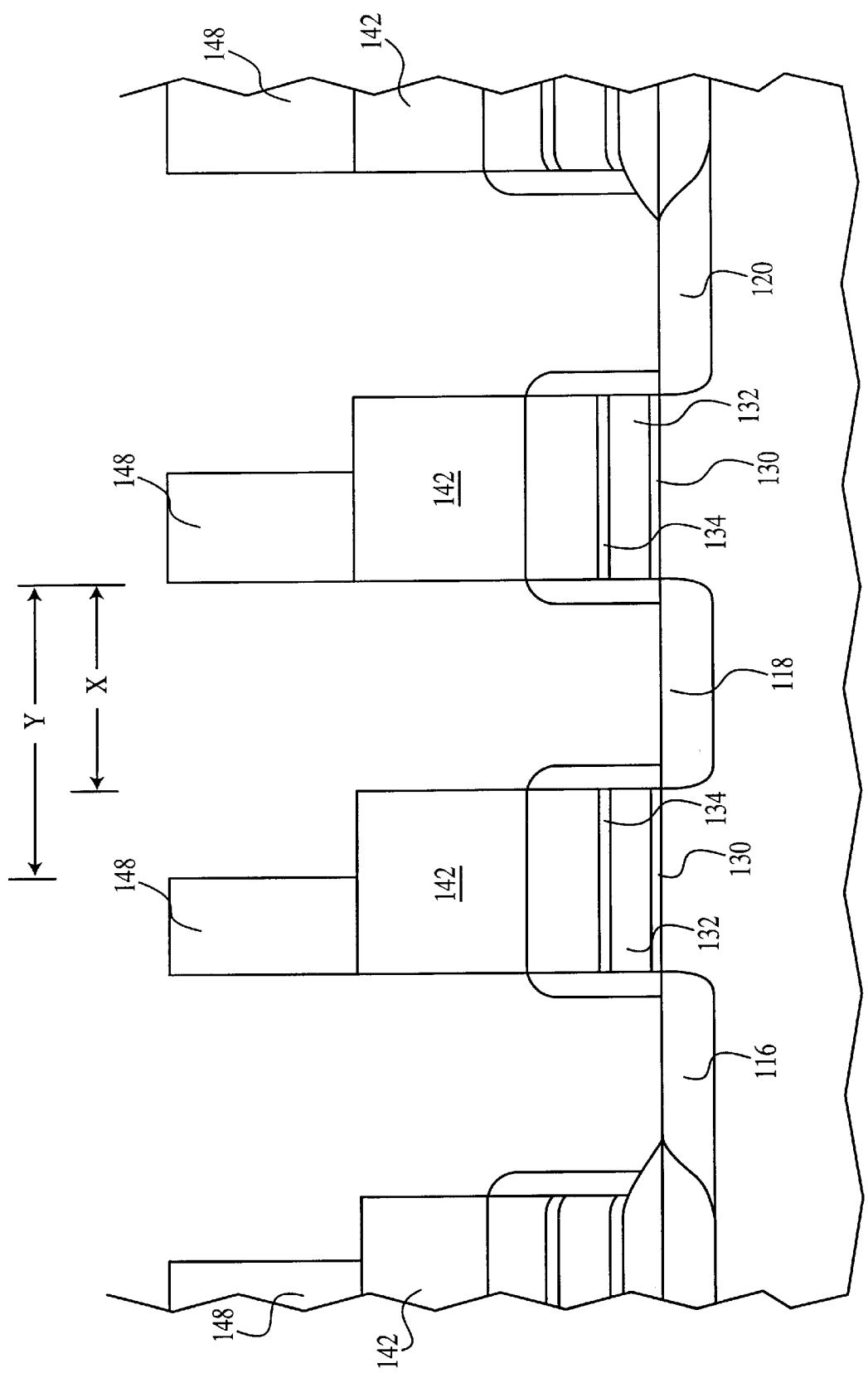
FIG. 12 is a diagrammatic cross-sectional view of a portion of a semiconductor wafer at a processing step subsequent to that shown in FIG. 11.

The oxide layer 140 is then removed as shown in FIG. 12 by a conventional pre-cleaning step, such as contacting the oxide layer 140 with an aqueous HF acid solution for from about 30 to about 45 seconds at about 25° C.

Figure 13:
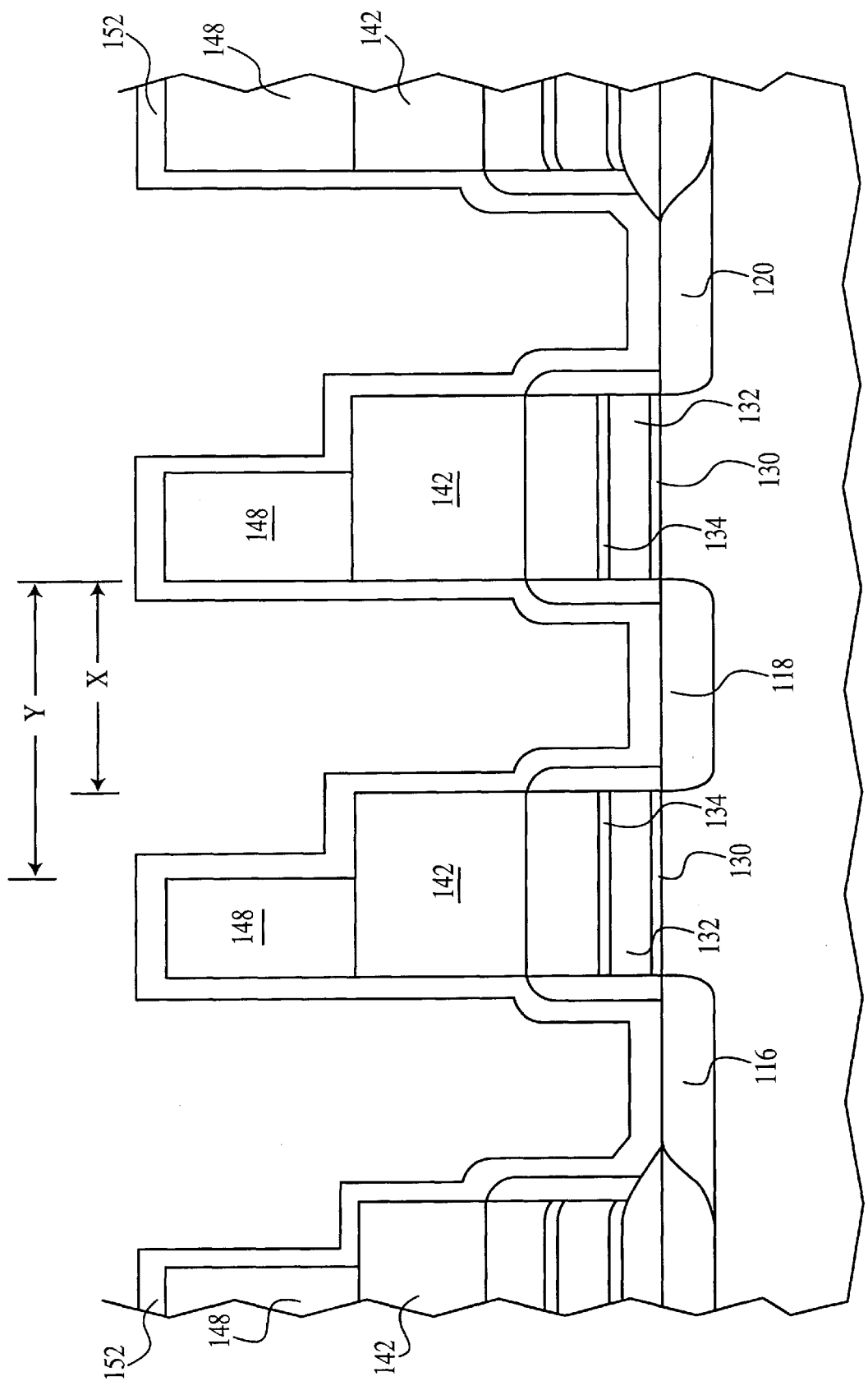
FIG. 13 is a diagrammatic cross-sectional view of a portion of a semiconductor wafer at a processing step subsequent to that shown in FIG. 12.

Referring now to FIG. 13, a layer 152 of conductive layer 152 is deposited. The conductive layer 152 may be formed of any conductive material such as, HSG (hemispherical grained poly), doped polysilicon, a metal or alloy, such as W, Ti, TiN, Ru, Pt, Ir, silica, silicon, germanium or an alloy of silica or germanium to increase capacitance or the like. The conductive layer 152 may be deposited onto the substrate by CVD, LPCVD, PECVD, MOCVD, sputtering or other suitable deposition techniques. Preferably the conductive layer 152 has a thickness of about 100 to about 1000 Angstroms, more preferably less than 500 Angstroms. Preferably the conductive layer 152 is formed of HSG (hemispherical grained poly). If HSG is used, the conductive layer 152 may be formed by first depositing a layer of in situ doped polysilicon followed by a deposition of undoped HSG. Subsequent heating inherent in wafer processing will effectively conductively dope the overlying HSG layer. Alternatively, the conductive layer 152 may be provided by in situ arsenic doping of an entire HSG layer or the conductive layer 152 may be formed by depositing amorphous silicon at this step and then using a selective seed followed by an annealing process and chemical mechanical polishing.

Figure 14:
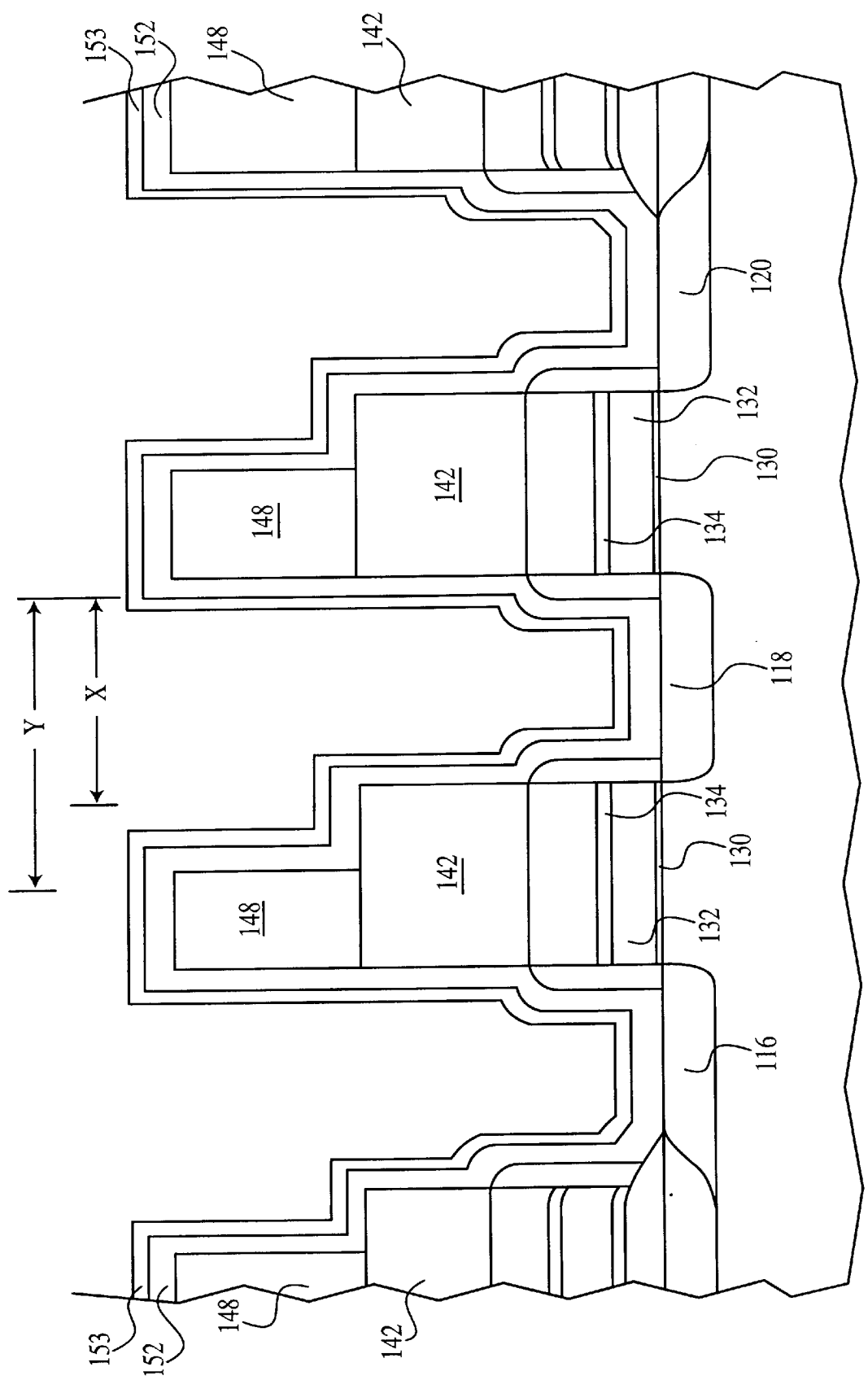
FIG. 14 is a diagrammatic cross-sectional view of a portion of a semiconductor wafer at a processing step subsequent to that shown in FIG. 13.

Referring now to FIG. 14, a dielectric film layer 153 is formed over the surface of conductive layer 152. The term dielectric is used herein shall be understood to mean any solid, liquid or gaseous material that will not break down in the presence of an electrical field for use in the capacitor of a DRAM cell or other integrated circuit device containing a capacitor. The dielectric film may be, for example, a nitride film and though this nitride film may be formed using various methods, for example, a CVD nitrogen deposition. The dielectric layer 153 may also be formed from dielectric materials such as: $Ta_2O_5$, $SrTiO_3$, $Y_2O_3$, $Nb_2O_5$, $ZrO_2$, titanium oxide or the like. The dielectric film layer 153 preferably has a thickness of from about 10 to about 75 Angstroms, more preferably from about 15 to about 30 Angstroms.

Figure 15:
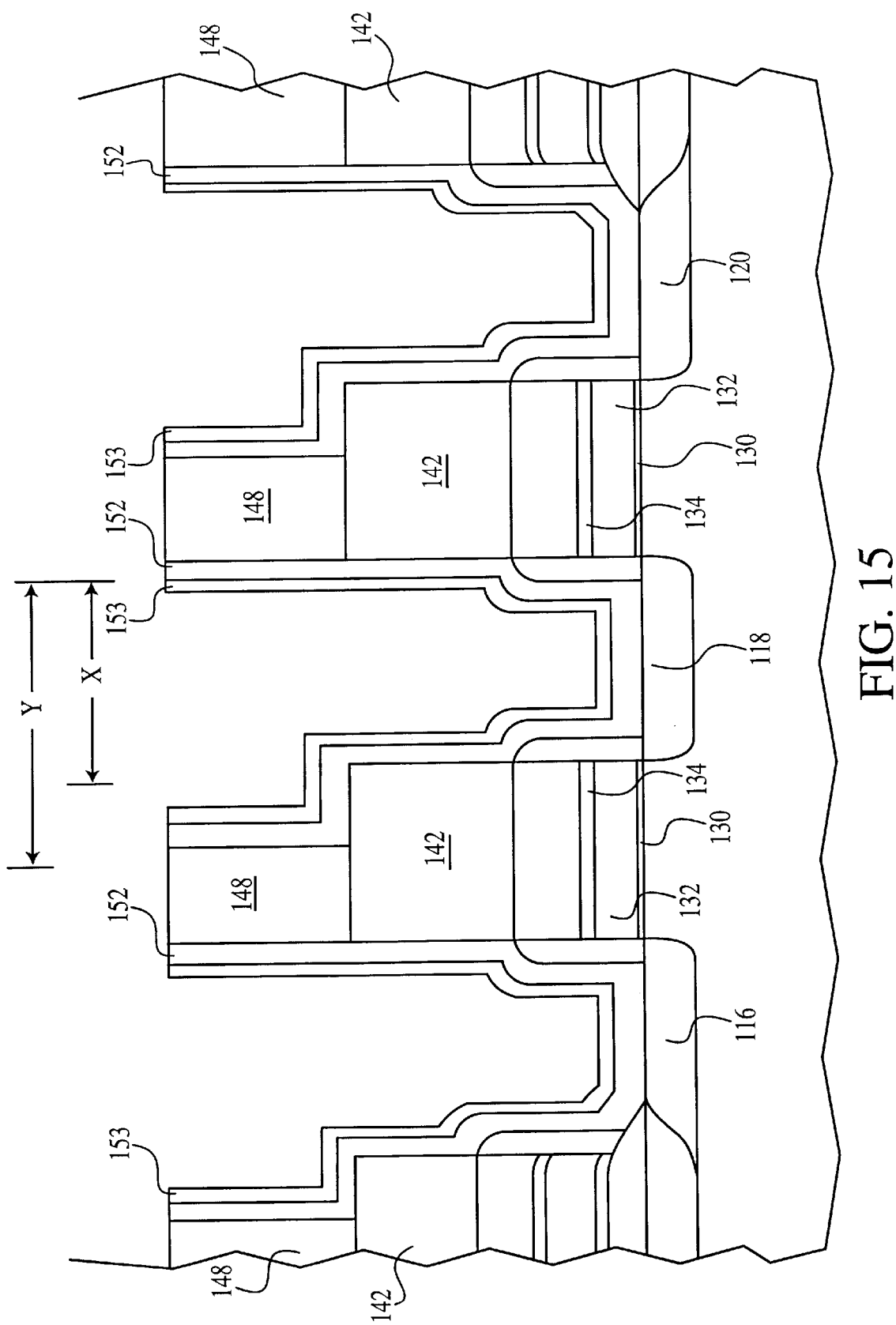
FIG. 15 is a diagrammatic cross-sectional view of a portion of a semiconductor wafer at a processing step subsequent to that shown in FIG. 14.

Referring now to FIG. 15, the portions of the conductive layer 152 and the dielectric layer 153 above the top of the second BPSG layer 148 are removed through a CMP or etching process, thereby electrically isolating the portions of conductive layer 152 and the capacitance layer 153.

Figure 16:
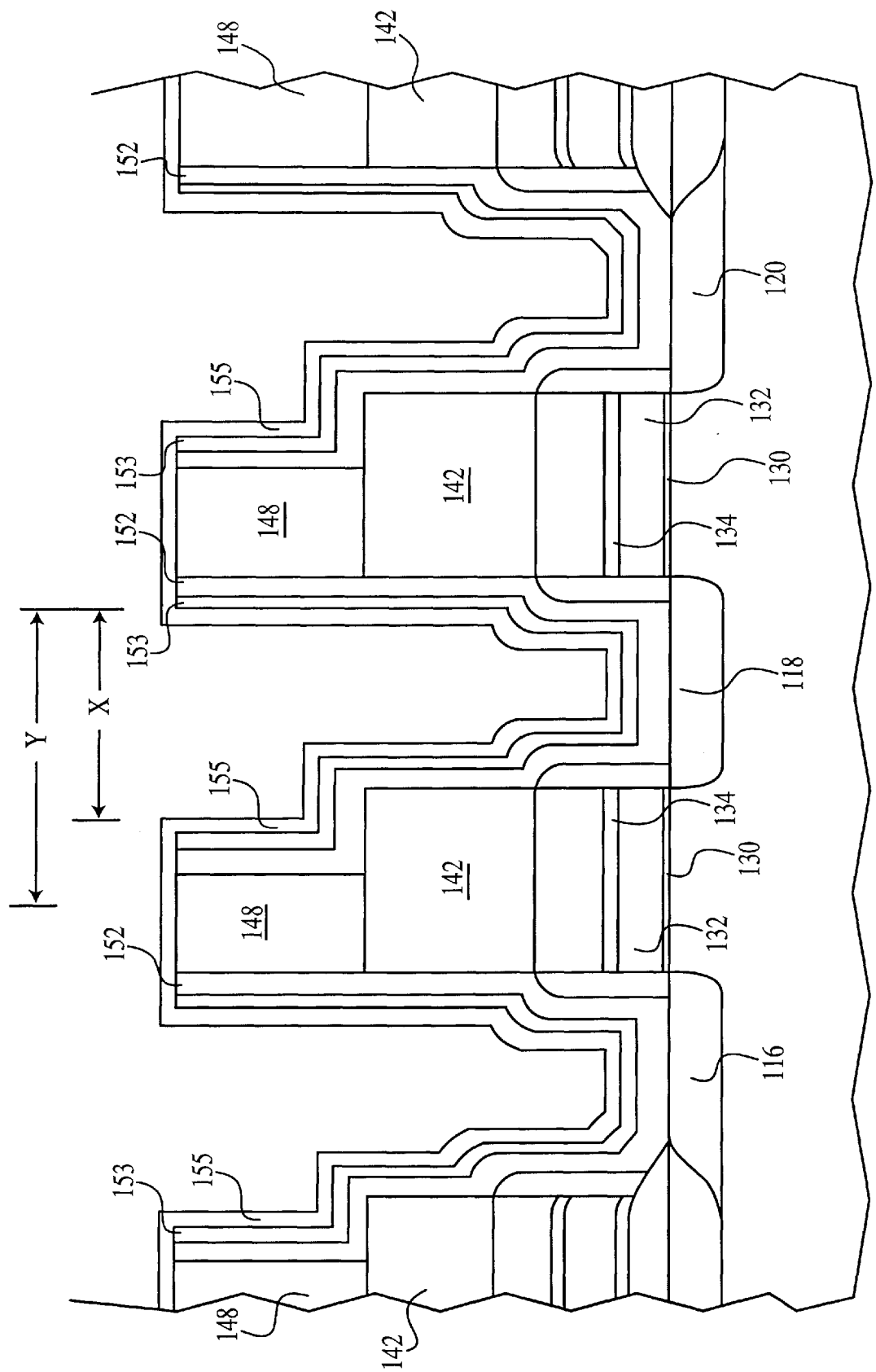
FIG. 16 is a diagrammatic cross-sectional view of a portion of a semiconductor wafer at a processing step subsequent to that shown in FIG. 15.

Referring now to FIG. 16, a second conductive layer 155 is deposited to form the corresponding electrode over the dielectric layer 153. The second conductive layer 155 may be formed of any of the materials described above with reference to the first conductive layer 152. Preferably the second conductive layer 155 is formed of doped polysilicon. The second conductive layer 155 is patterned and etched to arrive at the structure illustrated in FIG. 16.

Figure 1:
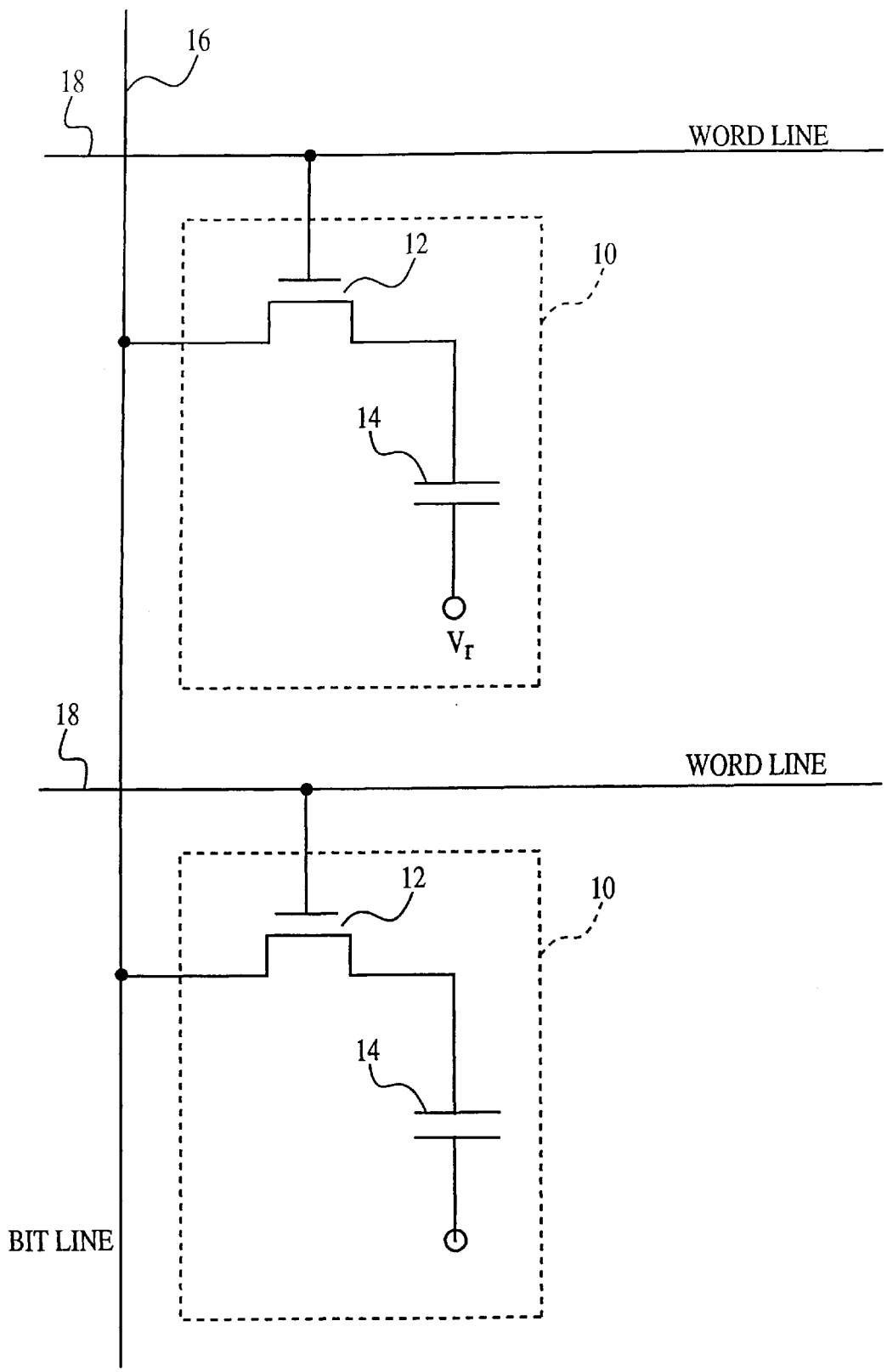
FIG. 1 is a circuit diagram of a portion of a conventional DRAM memory circuit.

In addition to serving as the second plate or corresponding electrode of the capacitor, the second conductive layer 155 also forms the interconnection lines between the second plates of the capacitors. The second plate of the capacitor is connected to the reference voltage, as discussed above in connection with FIG. 1. For example, an insulating layer may be applied and planarized and contact holes etched therein to form conductor paths to transistor gates, etc. Conventional metal and insulation layers are formed over the insulating layer and in the through holes to interconnect various parts of the circuitry in a manner similar to that used in the prior art to form gate connections. Additional insulating and passivation layers may also be applied.

Figure 17:
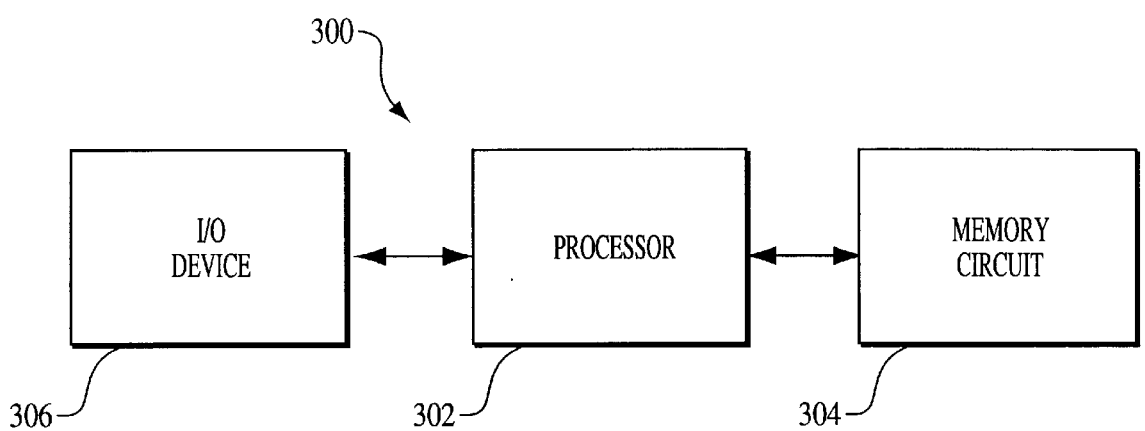
FIG. 17 is a block diagram of a computer system comprising a memory including a double sided capacitor.

FIG. 17 illustrates a computer system 300 which utilizes a memory employing capacitors of the type described above. The computer system 300 comprises a CPU (central processing unit) 302, a memory circuit 304, and an I/O (input/output) device 306. The memory circuit 304 contains a DRAM memory circuit including the capacitors according to the present invention. Memory other than DRAM may be used. Also, the CPU itself may be an integrated processor which utilizes integrated capacitors according to the present invention.

It should again be noted that although the invention has been described with specific reference to DRAM memory circuits and container capacitors, the invention has broader applicability and may be used in any integrated circuit requiring capacitors. Similarly, the process described above is but one method of many that could be used. Accordingly, the above description and accompanying drawings are only illustrative of preferred embodiments which can achieve and provide the objects, features and advantages of the present invention. It is not intended that the invention be limited to the embodiments shown and described in detail herein. The invention is only limited by the spirit and scope of the following claims.

What is claimed as new and desired to be protected by Letters Patent of the United States is:

1. An integrated circuit capacitor comprising:

a first electrode and a second electrode formed on a substrate; and a dielectric provided between said electrodes, said capacitor having a lower section formed in a first insulating layer and an upper section formed in a second insulating layer, said lower section being formed beneath said upper section, said upper section having a width greater than said lower section, wherein said first electrode has at least a portion which is both disposed over and in contact with said first insulating layer, wherein a portion of a third insulating layer is in contact with two opposing surfaces of said second electrode in said lower section, and wherein the third insulating layer is in contact with two opposing surfaces of said second electrode in said upper section.

2. The integrated circuit capacitor according to claim 1, wherein said capacitor is a container capacitor.

3. The integrated circuit capacitor according to claim 1, wherein said first electrode and second electrode are independently formed of a material selected from doped polysilicon, hemispherical grained polysilicon or a metal.

4. The integrated Circuit capacitor according to claim 3, wherein said first electrode is formed of hemispherical grained polysilicon.

5. The integrated circuit capacitor according to claim 3, wherein said second electrode is formed of doped polysilicon.

6. The integrated circuit capacitor according to claim 1, wherein said dielectric is selected from the group consisting of oxides and nitrides.

7. The integrated circuit capacitor according to claim 6, wherein said dielectric is an oxide selected from the group consisting of $Ta_2O_5$, $SrTiO_3$, $Y_2O_3$, $Nb_2O_5$, $ZrO_2$ titanium oxide, and silicon nitride.

8. The integrated circuit capacitor according to claim 1, wherein said capacitor is a stacked capacitor.

9. The integrated circuit capacitor according to claim 1, wherein said first electrode is in direct contact with an active area of said substrate.

10. The integrated circuit capacitor according to claim 1, wherein said capacitor is part of a DRAM cell.

11. A computer system comprising:

a processor; and a memory circuit connected to the processor, wherein at least one of said processor and memory circuit contains at least one capacitor formed on a substrate having a first electrode and a second electrode with a dielectric layer provided between said electrodes, said capacitor having a lower section formed in a first insulating layer and an upper section formed in a second insulating layer, said lower section being formed beneath said upper section, said upper section having a width greater than said lower section, wherein said first electrode has at least a portion which is both disposed over and in contact with said first insulating layer, wherein said first electrode has a lower portion which is in contact with insulating spacers, said insulating spacers being a different material than said first insulating layer.

12. The computer system according to claim 11, wherein said capacitor is a container capacitor.

13. The computer system according to claim 11, wherein said first electrode and second electrode are independently formed of a material selected from doped polysilicon, hemispherical grained polysilicon or a metal.

14. The computer system according to claim 13, wherein said first electrode is formed of hemispherical grained polysilicon.

15. The computer system according to claim 13, wherein said second electrode is formed of doped polysilicon.

16. The computer system according to claim 11, wherein said dielectric is selected from the group consisting of oxides and nitrides.

17. The computer system according to claim 16, wherein said dielectric is an oxide selected from the group consisting of $Ta_2O_5$, $SrTiO_3$, $Y_{203}$, $Nb_2O_5$, $ZrO_2$ titanium oxide, and silicon nitride.

18. The computer system according to claim 11, wherein said capacitor is a stacked capacitor.

19. The computer system according to claim 11, wherein said first electrode is in direct contact with an active area of said substrate.

20. The computer system of claim 11, wherein said memory circuit is a DRAM memory circuit.

21. A memory cell comprising:

a transistor; and a capacitor formed on a substrate having a first electrode and a second electrode with a dielectric layer provided between said electrodes, said transistor and capacitor being connected in a memory array, said capacitor having a lower section formed in a planar first insulating layer and an upper section formed in a second insulating layer, said lower section being formed beneath said upper section, said upper section having a width greater than said lower section, and wherein said first electrode has at least a portion which is both disposed over and in contact with said first insulating layer.

22. The memory cell according to claim 21, wherein said capacitor is a container capacitor.

23. The memory cell according to claim 21, wherein said first electrode and second electrode are independently formed of a material selected from doped polysilicon, hemispherical grained polysilicon or a metal.

24. The memory cell according to claim 23, wherein said first electrode is formed of hemispherical grained polysilicon.

25. The memory cell according to claim 23, wherein said second electrode is formed of doped polysilicon.

26. The memory cell according to claim 21, wherein said dielectric is selected from the group consisting of oxides and nitrides.

27. The memory cell according to claim 21, wherein said capacitor is a stacked capacitor.

28. The memory cell according to claim 21, wherein said first electrode is in direct contact with an active area of said substrate.

29. The memory cell according to claim 21, wherein said integrated circuit is a DRAM cell.

30. A DRAM cell having a container capacitor, said capacitor comprising:

a first electrode and a second electrode formed on a substrate; and a dielectric provided between said electrodes, said capacitor having a lower section formed in a first insulating layer and an upper section formed in a second insulating layer, said lower section being formed beneath said upper section, said upper section having a width greater than said lower section, wherein said first electrode has at least a portion which is both disposed over and in contact with said first insulating layer, wherein a portion of a third insulating layer is in contact with two opposing surfaces of said second electrode in said lower section, and wherein a portion of said third insulating layer is in contact with two opposing surfaces of said second electrode in said upper section.

31. The DRAM cell according to claim 30, wherein said capacitor is a container capacitor.

32. The DRAM cell according to claim 30, wherein said first electrode and second electrode are independently formed of a material selected from doped polysilicon, hemispherical grained polysilicon or a metal.

33. The DRAM cell according to claim 32, wherein said first electrode is formed of hemispherical grained polysilicon.

34. The DRAM cell according to claim 32, wherein said second electrode is formed of doped polysilicon.

35. The DRAM cell according to claim 30, wherein said dielectric is selected from the group consisting of oxides and nitrides.

36. The DRAM cell according to claim 30, wherein said capacitor is a stacked capacitor.

37. The DRAM cell according to claim 30, wherein said first electrode is in direct contact with an active area of said substrate.

38. The DRAM cell according to claim 30, wherein said integrated circuit is a DRAM cell.

* * * * *

UNITED STATES PATENT AND TRADEMARK OFFICE
CERTIFICATE OF CORRECTION

PATENT NO. : 6,693,015 B2
DATED : February 17, 2004
INVENTOR(S) : Robert K. Carstensen It is certified that error appears in the above-identified patent and that said Letters Patent is hereby corrected as shown below:

Column 4,
Line 58, change "space formed" to -- space Y formed --;

Column 7,
Line 14, change "layer, wherein" to -- layer, and wherein --; and

Column 8,
Line 34, change "$Y_{203}$" to -- $Y_2O_3$ --.

Signed and Sealed this

Thirteenth Day of July, 2004

JON W. DUDAS
*Acting Director of the United States Patent and Trademark Office*